United States Patent [19]

Yoldas

[11] 4,168,960
[45] Sep. 25, 1979

[54] METHOD OF MAKING A GLASS ENCAPSULATED DIODE

[75] Inventor: Bulent E. Yoldas, Pittsburgh, Pa.

[73] Assignee: Westinghouse Electric Corp., Pittsburgh, Pa.

[21] Appl. No.: 897,323

[22] Filed: Apr. 18, 1978

[51] Int. Cl.² .................................................. C03B 27/02
[52] U.S. Cl. ............................................. 65/32; 65/36; 65/41; 65/54; 65/59 B
[58] Field of Search .................. 65/54, 41, 36, 59 R, 65/59 B, 32

[56] References Cited

U.S. PATENT DOCUMENTS

| | | | |
|---|---|---|---|
| 2,046,545 | 9/1977 | Sanford et al. | 65/64 |
| 3,271,124 | 9/1966 | Clark | 65/54 |
| 3,446,695 | 5/1969 | Janakirama-Rao | 65/59 R |
| 3,475,662 | 10/1969 | Zido | 317/234 |
| 3,476,987 | 11/1969 | Zido et al. | 317/234 |
| 3,476,988 | 11/1969 | Zido | 317/234 |
| 3,486,084 | 12/1969 | Zido | 317/234 |

*Primary Examiner*—Arthur D. Kellogg
*Attorney, Agent, or Firm*—J. B. Hinson

[57] ABSTRACT

A glass encapsulated semiconductor diode and a method for glass encapsulation of a fusion to form a semiconductor diode is disclosed. The fusion comprises a body of semiconductor material having a PN junction therein and metal electrodes affixed to opposed major surfaces thereof. The fusion is encircled by a ring-shaped glass member with an inner surface of the ring-shaped glass member fused to an edge surface of the body of semiconductor material to form a protective layer overlying the PN junction. The ring-shaped glass member is formed and fused to the edge of the body of semiconductor material by placing the fusion and a prefabricated glass ring, preferably cut from stress relieved glass tubing, encircling the fusion in a furnace. A weight is applied to the upper surface of the prefabricated glass ring. An atmosphere comprising a predetermined mixture of nitrogen and water vapor is established in the fusion furnace and the temperature of the fusion furnace is increased and decreased in accordance with a predetermined program to cause the prefabricated glass ring to soften and fuse to the edge surface of the body of semiconductor material to form a protective layer, comprising the ring-shaped glass member, overlying the PN junction.

14 Claims, 14 Drawing Figures

U.S. Patent  Sep. 25, 1979  Sheet 1 of 6  4,168,960
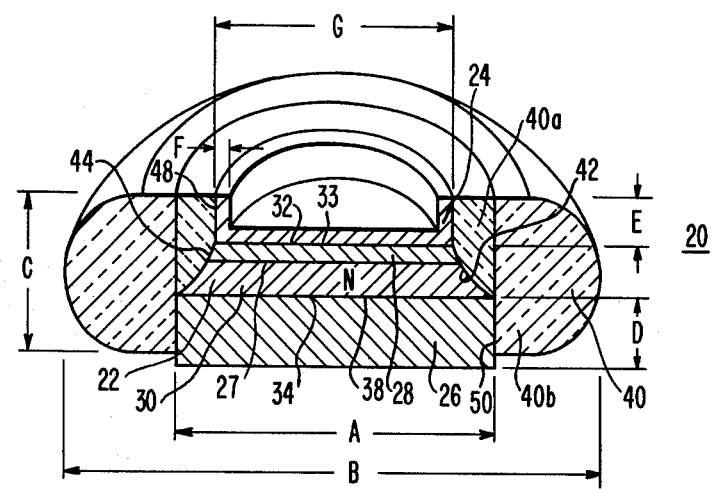
FIG. 1
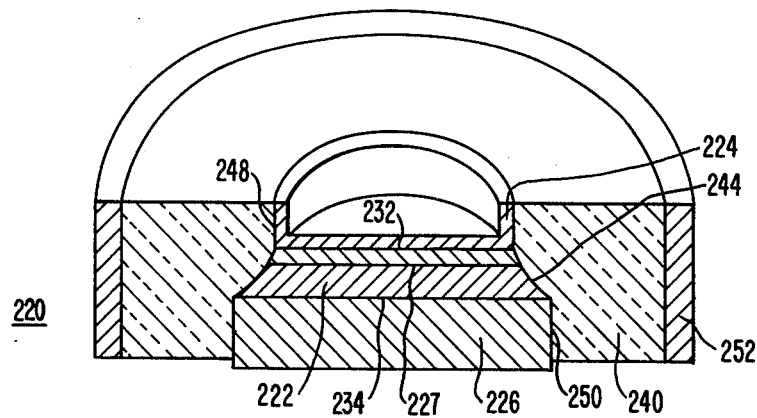
FIG. 6
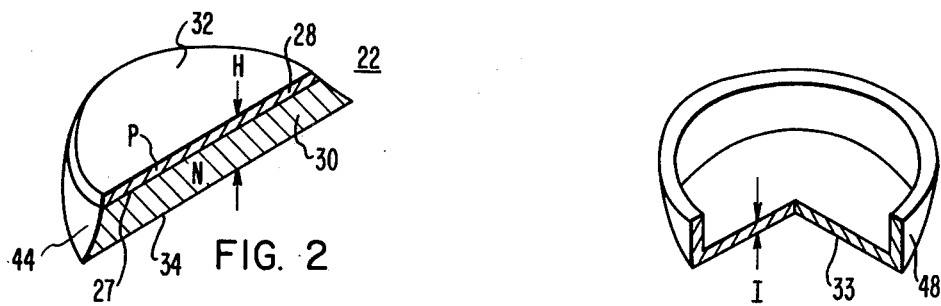
FIG. 2
FIG. 3
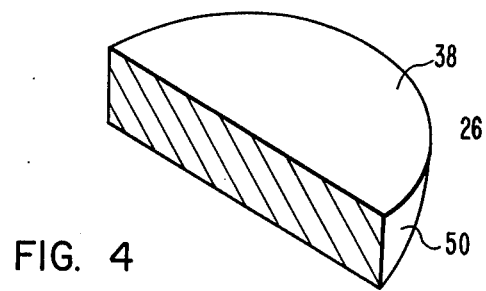
FIG. 4

METHOD OF MAKING A GLASS ENCAPSULATED DIODE

BACKGROUND OF THE INVENTION

1. Field of the Invention

The invention relates to semiconductor devices and more specifically to glass encapsulated semiconductor diodes and to a method of fusing glass to a body of semiconductor material to form an encapsulation providing passivation, a hermetic seal and environmental protection for a PN junction within the body of semiconductor material.

2. Description of the Prior Art

Prior art semiconductor diodes using glass fused directly to the semiconductor portion of the diode as the sole means of protecting the PN junction from the environment have been limited to relatively low current diodes. An example of such a diode is type UT4005 manufactured and sold by the Unitrode Corporation. It is also known in the prior art to encapsulate semiconductor devices in thermosetting resinous insulating material. Examples of such hermetically sealed diodes using resinous material are disclosed in Pat. Nos. 3,475,662, 3,476,987 and 3,476,988 as well as 3,486,084. Thin glass protective layers are also available in the prior art to passivate large prior art semiconductor devices. Glass forming these layers was typically applied to the body of semiconductor as a slurry and the device and the powdered glass were heated to fuse the glass and form a protective glass layer. Glass layers formed using this technique were limited to thicknesses in the order of 20 to 30 microns. These thin layers are not sufficient to provide complete environmental protection for PN junctions and other circuit elements within the body of semiconductor material.

SUMMARY OF INVENTION

The diode which is the subject of this invention utilizes a body of semiconductor material which includes a PN junction formed by the interface of P and N conductivity type regions which respectively extend from the PN junction to opposed substantially flat major surfaces of the body of semiconductor material. The area of the PN junction is coextensive with the area of the body or semiconductor material. That is, the junction extends entirely across the body of semiconductor material and terminates at an edge portion thereof, the edge portion of the body of semiconductor material extending from one major surface to the other. Electrodes are affixed to the opposed major surfaces of the body of semiconductor material by soldering, brazing or other suitable techniques known to those skilled in the art. The area of the electrodes is substantially coextensive with the area of the surface of the body of semiconductor material to which they are affixed. The body of semiconductor material and the electrodes affixed thereto are for convenience referred to as a fusion.

The fusion is encircled by an annular or ring-shaped glass member having inner and outer surfaces. The inner surface of the glass member is fused to the edge of the body of semiconductor material to form an encapsulation or seal which provides environmental protection for the PN junction. (Encapsulation is used to mean the formation of a protective layer overlying selected portions of the body of semiconductor material to prevent degradation of the characteristics of a PN junction within the body of semiconductor material.) The ring-like glass member is fused to the edge of the semiconductor body by assembling the fusion and a dense prefabricated glass ring in a jig such that the prefabricated glass ring encircles the fusion. (The term "dense" is used to define glass rings made from glass which has been completely melted to form rings substantially free of voids and having a smooth inner surface. Rings cut from commercial quality stress relieved glass tubing meet this criteria.) Pressure is applied between top and bottom surfaces of the prefabricated glass ring. The fusion and the prefabricated glass ring are heated in a controlled atmosphere comprising a mixture of nitrogen, or some other inert gas, and water vapor causing the prefabricated glass ring to soften and fuse to the edge portion of the body of semiconductor material to form a protective layer over the PN junction. (Inert is used to designate any gas which does not react in a detrimental way with any components of the diode, nitrogen for example.) The temperature of the fusion furnace is controlled to prevent detrimental stresses from developing due to dimensional changes of the fusion and the glass.

By using dense glass rings, interfacial fusion between the body of semiconductor material and glass is attained at relatively low temperatures without the need for total melting of glass. This lowers the temperature required and reduces the glass shrinkage. Lowering the temperature required and reducing the skrinkage increases the thickness of glass layers which can be fused directly to semiconductor materials for the purpose of protecting PN junctions therein.

DESCRIPTION OF DRAWINGS

FIG. 1 is a drawing illustrating the preferred embodiment of the diode which is the subject of the invention with portions shown in cross-section.

FIG. 2 is a drawing of the body of semiconductor material utilized by the diode illustrated in FIG. 1.

FIG. 3 is a drawing of the top electrode of the diode illustrated in FIG. 1.

FIG. 4 is a drawing of the bottom electrode of the diode illustrated in FIG. 1.

FIG. 6 is a drawing of a second diode which can be constructed using the disclosed process.

DESCRIPTION OF PREFERRED EMBODIMENT

Figure 5:
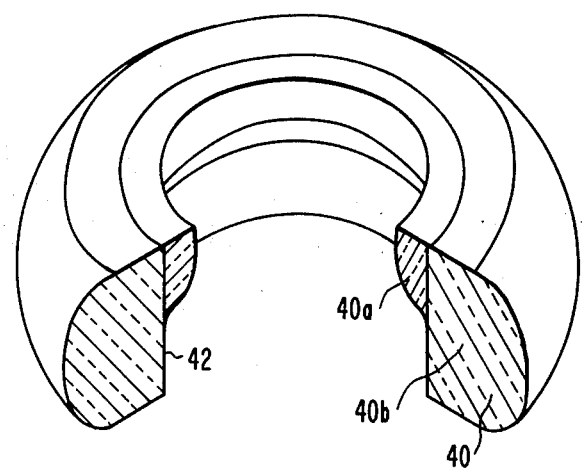
FIG. 5 is a drawing of the ring-like glass member utilized by the diode illustrated in FIG. 1.

The subject matter of the invention is a diode 20 and the method of encapsulating a fusion to form a semiconductor diode.

Diode 20 utilizes a fusion consisting of a body of semiconductor material 22 (preferably silicon, separately illustrated in FIG. 2) and first and second electrodes 24 and 26 (separately illustrated in FIG. 3 and 4). Electrodes 24 and 26 are preferably a refractory metal such as, for example, molybdenum, tungsten, tantalum, base alloys and mixtures thereof.

The body of semiconductor material 22 includes a PN junction 27 at the interface of P conductivity type region 28 and N conductivity type region 30. The P and N conductivity type regions, 28 and 30, respectively extend from the PN junction 27 to upper and lower surfaces, 32 and 34, of the body of semiconductor material 22. Electrode 24 is preferably cup-shaped and includes a lower surface 33 which is affixed to the upper surface 32 of the body of semiconductor material 22. Similarly, electrode 26 includes an upper surface 38 which is affixed to the lower surface 34 of the body or semiconductor material 22. Electrodes 24 and 26 may be affixed to the respective surfaces of the semiconductor body 22 by soldering, brazing or any other suitable technique known to those skilled in the art. The body of semiconductor material with the electrodes affixed thereto is referred to as a fusion.

The fusion consisting of the body of semiconductor material 22 and electrodes 24 and 26 is encircled by a preferably coaxially positioned annularly shaped or ring-like electrically insulating glass member 40, which is separately illustrated in FIG. 5. (Coaxially positioned means that the fusion and annularly shaped glass member 40 have a common vertical axis of symmetry.) Inner surface 42 of ring-like glass member 40 is fused to edge portion 44 of the body of semiconductor material 22 as well as to outer surfaces, 48 and 50, of the electrodes, 24 and 26. Ring-like glass member 40 preferably includes two regions, 40a and 40b. Region 40a is preferably a lead-aluminum-borosilicate glass such as IP745 sold commercially by Innotech. Region 40b is preferably a zinc-silicate glass such as IP645 also sold commercially by Innotech. Alternatively, both regions, 40a and 40b, may also be type IP745 glass. These glasses are described in detail hereinafter.

A fused junction is formed along the inner surface 42 of annular shaped glass member 40 and the outer edge portion 44 of the body of semiconductor material 22. This fused junction provides a hermetic seal or encapsulation protecting the PN junction 27. However, additional protection is provided by the fused junction between the inner surface 42 of ring-like glass member 40 and the outer surfaces, 48 and 50, of the electrodes, 24 and 26.

Bottom electrode 26 extends beyond the lower surface of the annular shaped glass member 40. This permits contact to be made with the bottom electrode 26 through a flat surface without interference by annularly shaped glass member 40.

Embodiments of the diode 20 actually constructed have a voltage rating of 600 volts, a current rating of 150 amps and the following dimensions:

| Dimension Identification Character | Dimension in Inches |
|---|---|
| A (FIG. 1) | 0.625 |
| B (FIG. 1) | 0.915 |
| C (FIG. 1) | 0.068 |
| D (FIG. 1) | 0.035 |
| E (FIG. 1) | 0.040 |
| F (FIG. 1) | 0.010 |
| G (FIG. 1) | 0.480 |
| H (FIG. 2) | 0.010 |
| I (FIG. 3) | 0.010 |

In the diodes actually constructed the glass member 40 was a lead borosilicate glass such as IP745 sold in Innotech Corp. Alternatively, diodes in which the glass member 40 included a first region 40a of lead borosilicate glass and a second region 40b of zinc borosilicate glass, such as IP660 also sold by Innotech Corp. have also been constructed. Either embodiment functions satisfactorily, however, the combination of the lead borosilicate and the zinc borosilicate glasses has been found to yield superior results. The lead borosilicate glass has a composition by weight of $36\pm4\%$ $SiO_2$, $15\pm3\%$ $B_2O_3$, $45\pm3\%$ PbO and $3\pm1\%$ $Al_2O_3$. The zinc borosilicate glass has a composition by weight of $55\pm5\%$ ZnO, $31\pm4\%$ $B_2O_3$, $8\pm2\%$ $SiO_2$, $4.5\pm1\%$ CeO and approximately 1.0% $Al_2O_3$.

Figure 7:
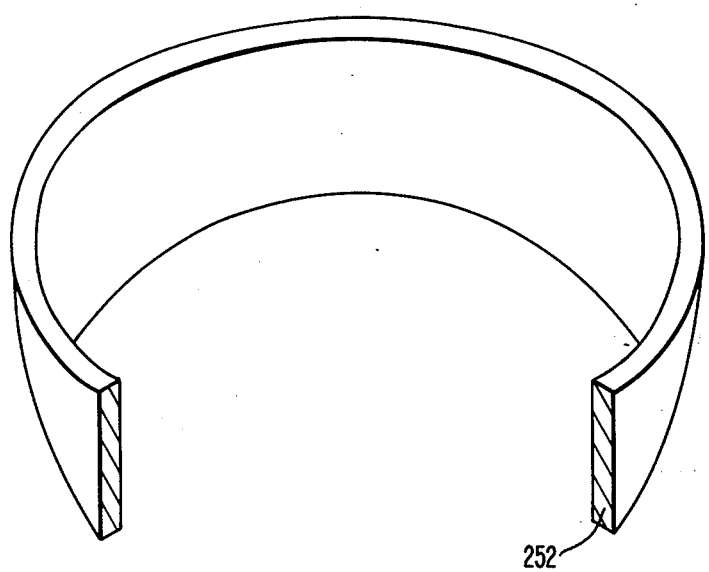
FIG. 7 is a diagram illustrating the ring-like metallic member utilized by the diode illustrated in FIG. 6.

FIG. 6 illustrates a second diode 220 which may be constructed using the disclosed process. This diode 220 is the subject of patent application, U.S. application Ser. No. 891,090, filed Mar. 28, 1978, the assignee of which is the same as that of the present invention. The same reference numbers as used in FIG. 1 plus 200 are used to identify similar parts of the diode 220. For example, the diode 220, illustrated in FIG. 6, utilizes a fusion comprising a body of semiconductor material 222 having a PN junction 227 therein and electrodes 226 and 224 respectively affixed to the upper and lower surfaces 232 and 234 of the body of semiconductor material 222. The fusion is encircled by a ring-like glass member 240 which is fused to the edge surface 244 of the body of semiconductor material 222 as well as to the edges 248 and 250 of the top and bottom electrodes 224 and 226. Ring-like glass member 240 may also include two regions similar to regions 40a and 40b (FIG. 1). However, only one region is shown to illustrate an alternate embodiment of the ring-like glass member 240. The ring-like glass member 240 is encircled by a ring-like metallic member 252 (separately illustrated in FIG. 7). The thermal characteristics of the ring-like glass member 242 and the ring metallic member 252 are selected such that ring-like metallic member 252 maintains the ring-like glass member 240 in compression. Suitable materials for ring-like metallic member 240 include Kovar, titanium and steel. Kovar is a trademark for an alloy consisting of 20% nickel, 17% cobalt, 0.2% manganese with the balance iron. Ceramics, including zircon ($Z_2SiO_4$), mullite ($Al_2O_3 2SiO_2$), porcelain, titanium ($TiO_2$) and spinel ($MgAl_2O_4$) are also usable.

The process for constructing the two diodes 20 and 220 described above are very similar. Therefore, the preferred process for constructing the diode 20, illustrated in FIG. 1, will first be described in detail and then the modifications for constructing the diode 220, illustrated in FIG. 2, will be discussed.

The first step in constructing the diode 20 is to affix the bottom electrode 26 and the top electrode 24 to the body of semiconductor material 22 to form the fusion. In the preferred embodiment bottom electrode 26 is affixed to the body of semiconductor material 22 by silver soldering the top surface 38 of electrode 26 to the bottom surface 34 of the body of semiconductor material 22. Silver solders are available to permit this process to be carried out at a temperature ranging from 800° C. to 900° C. The silver solder may be an alloy of lead, tin and silver. These solders are commercially available.

The top electrode 24 is affixed to the top surface 32 of the body of semiconductor material 22 by soldering or brazing the bottom surface 33 of electrode 24 to the top surface 32 of the body of semiconductor material 22 using aluminum. Suitable prior art processes are available for performing this operation at a temperature ranging from 500° C. to 550° C.

In general, electrodes 24 and 26 may be affixed to the body of semiconductor material 22 using any suitable process known to those skilled in the art.

After the electrodes, 24 and 26, have been affixed to the body of semiconductor material 22 the edge 44 of the body of semiconductor material 22 is beveled to complete the fusion. The beveling is preferably carried out by sandblasting followed by a chemical polishing and etching in a mixture consisting of hydrofluoric, nitric and acetic acids. This polishing technique is well-known in the semiconductor industry and can be performed using commercially available etchants and equipment.

Figure 8:
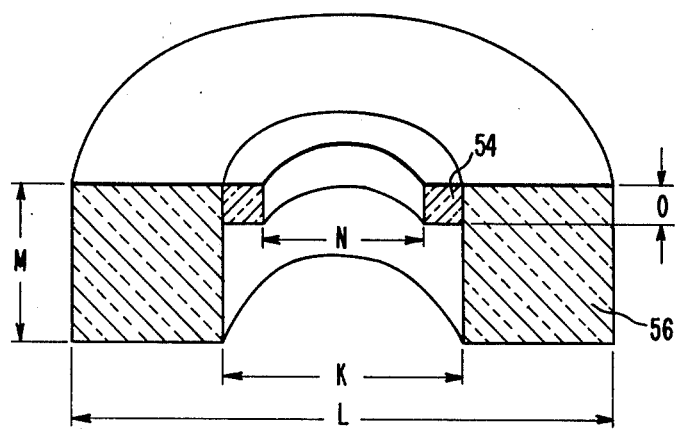
FIG. 8 is a drawing illustrating the prefabricated glass rings used in constructing the diode illustrated in FIG. 1.

Diode 20 is constructed from the fusion described above and first and second prefabricated glass rings, 54 and 56 (separately illustrated in FIG. 8). A single preformed glass ring can also be used. However, two preformed glass rings are preferred because this permits the glass overlying the PN junction 27 (FIG. 1) to be selected to optimize the protection of the PN junction 27 and the remainder of the glass to be selected based on its electrical insulation, thermal and mechanical properties.

The first step in constructing the diode 20 is to clean the fusion and the prefabricated glass rings, 54 and 56, using the following procedure:

A. Boil all the components in reagent grade trichloroethylene;

B. Rinse all the components twice (one minute each time) in reagent grade trichloroethylene;

C. Rinse all the components ultrasonically twice (one minute each time) in reagent grade acetone; and D. Dry in room air on filter paper.

Figure 9:
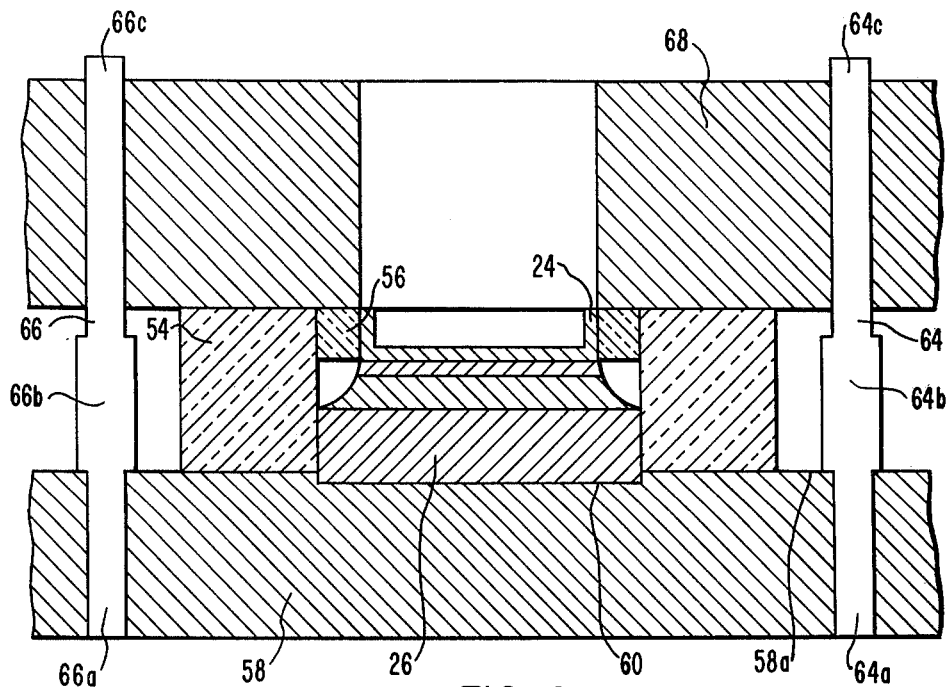
FIG. 9 is a diagram illustrating the jig used to support the fusion and prefabricated glass rings in the fusion furnace.

Following cleaning as described above, all the components are assembled in a jig as illustrated in FIG. 9. The jig utilizes a graphite base member 58 having a recess 60 therein. The recess 60 is circular and has a diameter slightly larger than the diameter of the bottom electrode 26. This permits the fusion to be assembled in the jig such that the bottom electrode 26 is in the recess 60 in the base member 58.

The second prefabricated glass ring 56 is placed in concentric relationship with the top electrode 24 of the fusion. The first prefabricated glass ring 54 is then positioned concentric with the fusion and the second prefabricated glass ring member 56.

The base member 58 of the fixture includes two guide pins, 64 and 66. Each of the guide pins, 64 and 66, includes lower, middle and upper portions 66a, 66b, 66c and 64a, 64b and 64c. Portions 64a and 64c of guide pin 64 are smaller than portion 64b. Similarly, portions 66a and 66c are smaller than portion 66b. Each of the guide pins are positioned in a hole in the base member 58 such that the center portions 64b and 66b, are supported on the upper surface 58a of base member 58.

A top plate 68 is then positioned as shown in FIG. 9. The fusion and the prefabricated glass rings, 54 and 56, as assembled in the jig and illustrated in FIG. 9, are then placed in a fusion furnace having an initial temperature in the range of 350° C. and heated in a controlled atmosphere to fuse the prefabricated glass rings 54 and 56 to produce a ring-like glass member 40, consisting of two regions 40a and 40b, as illustrated in FIG. 1.

The preferred control atmosphere mentioned above consists of a mixture of nitrogen and water vapor having a total pressure of one atmosphere with the partial pressure of the water vapor being in the range of $10^{-3}$ to $10^{-2}$ atmospheres. The required water vapor is achieved by mixing approximately 2 parts of dry nitrogen with one part of wet nitrogen and flowing the mixture through the furnace. Dry nitrogen is passed through one inch of deionized water in a bubbler to form the required wet nitrogen. After the required atmosphere has been established, the temperature in the furnace is increased and decreased in accordance with the time temperature chart illustrated in FIG. 10.

Figure 10:
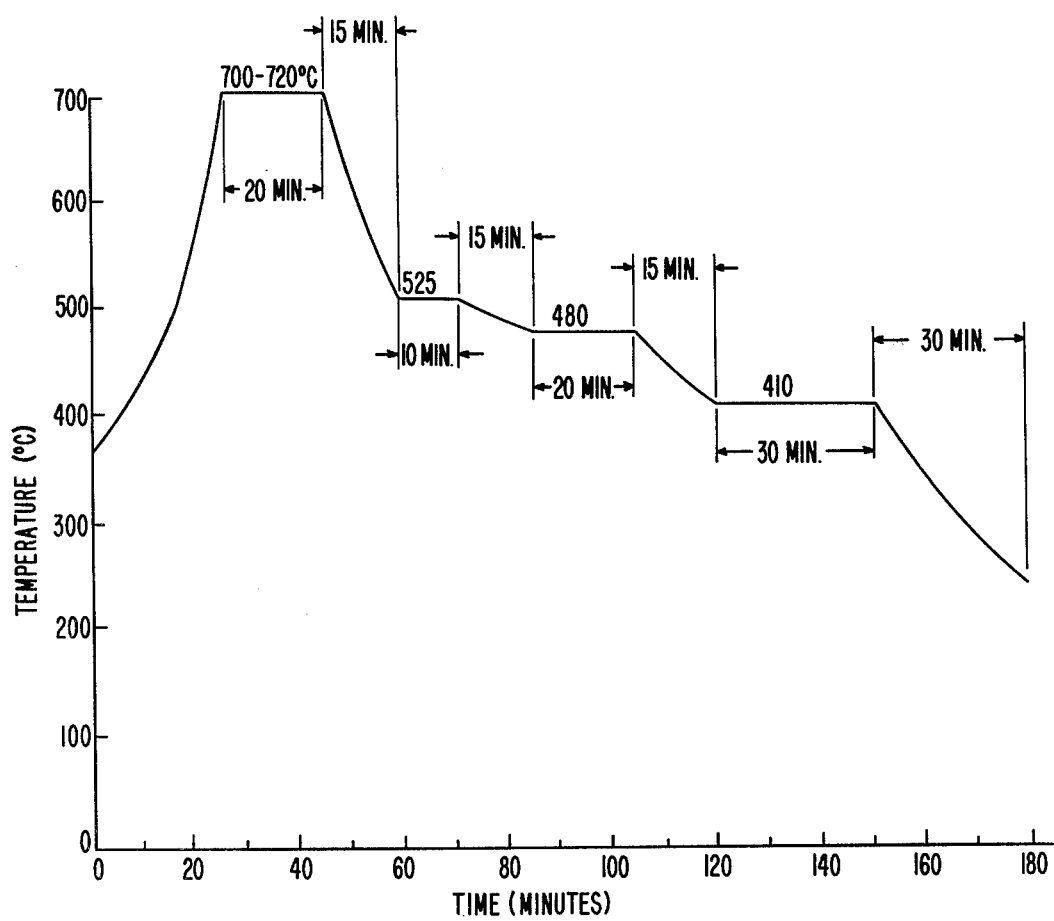
FIG. 10 is a time temperature profile of the fusion furnace.

As can be seen from FIG. 10, the temperature of the furnace is initially in the range of 350° C. The temperature is increased to a temperature in the range of 700° to 720° C. in a time interval of approximately 25 minutes. This temperature is maintained for a period of approximately 20 minutes. The prefabricated glass rings, 54 and 56, become soft and begin to flow at a temperature below 700° C. Wettability of glass for silicon and pressure due to top plate 68 causes the soft glass to flow evenly along the edges of semiconductor body 22 and the outer edges 48 and 50 of electrodes 24 and 26. The larger portions 64b and 66b of guide pins 64 and 66 limit the downward motion of the top plate 68 when the prefabricated glass rings, 54 and 56, soften and the glass flows. The height of the larger portions 64b and 66b of guide pins 64 and 66 determines dimension "C" FIG. 1. The surface tension of the soft glass causes the outer edge of the glass to form the circular shape as illustrated in FIG. 1. Small substantially flat areas may also be formed due to the interfaces of the base member 58 and the top plate 68 with the molten glass.

Additionally, it should be noted that the top electrode 24 is affixed to the body of semiconductor material 22 by brazing with aluminum. The silicon-aluminum alloy produced by this brazing melts below 600° C. However, using the disclosed process the top electrode 24 remains attached and the melting of the silicon-aluminum alloy does not degrade the PN junction 27.

Next, the furnace is cooled from approximately 720° C. to a temperature in the range of 525° C. in about 15 minutes. The furnace temperature is maintained in this range for approximately 10 minutes followed by a reduction to a temperature in the range of 480° C. in about 15 minutes. A temperature of 480° C. is maintained for 20 minutes followed by a reduction to 410° in 15 minutes. This temperature is maintained for approximately 30 minutes followed by a reduction of the furnace temperature to room temperature at a rate of approximately 10° C. per minute. This thermal cycle fuses the prefabricated glass rings, 54 and 56, to form ring-like glass member 40 and prevents the formation of possible harmful stresses therein.

In selecting a glass for the prefabricated glass rings 54 and 56, it is important that the thermal expansion coefficients for the glass be matched to or greater than the temperature expansion coefficients for the semiconductor body 22. It should also be noted that the expansion characteristics of the glass with temperature are different from the contraction characteristics when the glass is cooled. All of these characteristics must be considered in selecting the glass and the temperature cycle for the fusion furnace.

Glasses suitable for use in this invention should have a temperature expansion coefficient in the range of 4.0 to $6.0 \times 10^{-6}$ cm/cm/°C and the glass for the first prefabricated glass ring 54 which passivates the PN junction 27 should be substantially free of alkali ions. It is also preferable, although not required, that the thermal expansion coefficient of the second prefabricated glass ring 56 be slightly larger than the thermal expansion coefficient of the first prefabricated glass ring 54. In order to maintain the glass adjacent the PN junction 27 (FIG. 1) in compression. In addition;

(1) the glasses must have structural stability, e.g., must not devitrify or go through detrimental phase separation during the fusion process;

(2) the glass must have good chemical resistance to the environment and humidity;

(3) the glass must have thermal expansion characteristics compatible with those of the fusion;

(4) the glass adjacent the silicon semiconductor body 22 must wet and adhere thereto;

(5) the glass must have a viscosity low enough to flow;

(6) the glass must not chemically attack the surfaces of the semiconductor or the electrodes in a detrimental way;

(7) the thermal characteristics of the glass must be such that stresses can be relieved at temperatures within the limitations of the diode;

(8) the glass must have a fusion temperature below the degradation temperature of the device;

(9) the finished device must be resilient against thermal shock, thermal cycling and have good mechanical strength.

Glasses having a composition by weight of:

| Constituent | Percent |
| --- | --- |
| SiO$_2$ | 32–40% |
| B$_2$O$_3$ | 12–23% |
| PbO | 42–48% |
| Al$_2$O$_3$ | 2–6% | have been found to be suitable for the first prefabricated glass ring 54.

In particular, a glass having a composition of

| Constituent | % by Weight |
| --- | --- |
| SiO$_2$ | 36 ± 4% |
| B$_2$O$_3$ | 15 ± 3% |
| PbO | 45 ± 3% |
| Al$_2$O$_3$ | 3 ± 1% | have been found to be particularly satisfactory. This glass is sold commercially by Innotech under type No. IP-745.

The characteristics of the second prefabricated glass ring 56 are not as strenuous as those for the first prefabricated glass ring 54 in that the glass comprising the second prefabricated glass ring 56 can have more alkali ions present. It is also preferable that the second prefabricated glass ring 56 have a temperature expansion coefficient slightly larger than the first prefabricated glass ring 54 so that the glass adjacent the PN junction 27 (FIG. 1) is maintained in compression. A glass particularly suitable for the second prefabricated glass ring 56 has a composition by weight of:

| Constituent | % by Weight |
| --- | --- |
| ZnO | 55 ± 5% |
| B$_2$O$_3$ | 31 ± 4% |
| SiO$_2$ | 8 ± 2% |
| CeO | 4.5 ± 1% |
| Al$_2$O$_3$ | 1.0% (approximately) |

This glass is sold commercially by Innotech under the type No. IP660.

The prefabricated glass rings, 54 and 56, used to construct the diode 20 have the following dimensions:

| Dimension Identification Character | Dimension in Inches |
| --- | --- |
| K (FIG. 8) | 0.630 |
| L (FIG. 8) | 0.100 |
| M (FIG. 8) | 0.080 |
| N (FIG. 8) | 0.500 |
| O (FIG. 8) | 0.015 |

Figure 11:
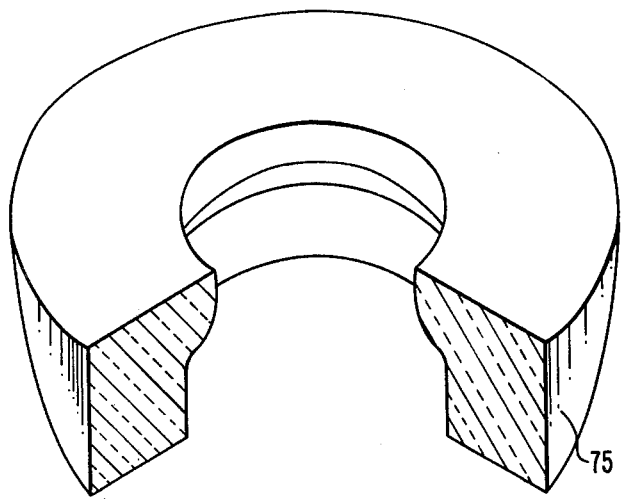
FIG. 11 is a drawing illustrating a second embodiment of the prefabricated glass ring utilized in constructing the diode.

In the preferred embodiment discussed above, the two prefabricated glass rings, 54 and 56, are fused to form the composite ring-like glass member 42 illustrated in FIG. 1. The ring-like member 40 has two regions 40a and 40b. The first region 40a is composed essentially of the IP745 glass while the second region 40b is comprised of the IP660 glass. Additionally, it should be noted that both of the preformed glass rings, 54 and 56, may be IP745 type glass. If only one type of glass is used a prefabricated glass ring 75 (illustrated in FIG. 11) having an appropriate cross-section may be constructed by sintering glass powder. However, in the diodes actually constructed, it has been found that the most successful combination is to have the first prefabricated glass ring 54 of IP745 glass while the second prefabricated glass ring 56 is IP660 type glass. Glass type IP745 is composed by weight of $36 \pm 4\%$ SiO$_2$, $15 \pm 3\%$ B$_2$O$_3$, $45 \pm 3\%$ PbO and $3 \pm 1\%$ Al$_2$O$_3$. Glass type IP660 is composed by weight of $55 \pm 5\%$ ZnO, $31 \pm 4\%$ B$_2$O$_3$, $8 \pm 2\%$ SiO$_2$, $4.5 \pm$CeO and approximately 1.0% Al$_2$O$_3$. It has also been found glass the second prefabricated glass ring 56 can be eliminated. However, eliminating this ring reduces the mechanical strength of the diode.

Superior results have also been achieved by utilizing prefabricated glass rings, 54 and 56, which are cut from stress relieved glass tubing. These superior results are believed to be related to the fact that prefabricated glass rings of this type have smoother interior surfaces and consistent prior thermal histories, i.e., they are all pulled from a melt.

Figure 12:
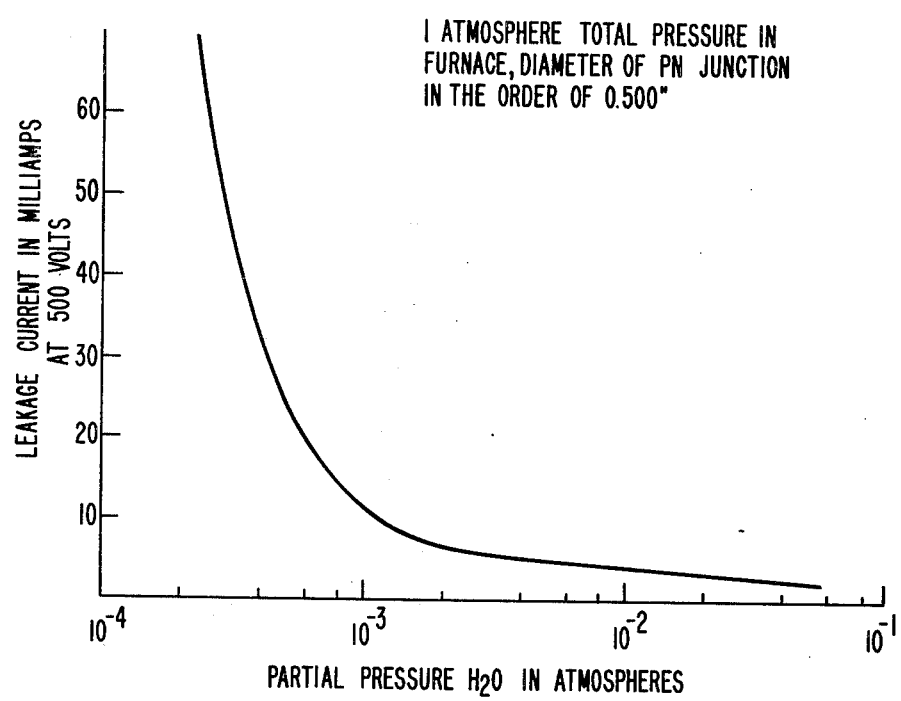
FIG. 12 is a drawing illustrating the relationship between the leakage current of the diode and the partial pressure of the water vapor in the fusion furnace.

FIG. 12 is a curve illustrating the relationship between the partial pressure of the water vapor in the fusion furnace and the leakage current of finished diodes. For example, at a water vapor partial pressure of $10^{-3.5}$ atmospheres the leakage current is in the range of 60 milliamps. An order of magnitude decrease in the leakage current is achieved by increasing the partial pressure of the water vapor to $10^{-2.5}$ atmospheres. As previously noted, the preferred water vapor pressure has been found to be in the range of $10^{-2}$ to $10^{-3}$ atmospheres with a total furnace pressure of one atmosphere.

If for some reason, it is desirable to operate the fusion furnace at a pressure other than one atmosphere, the partial pressures of the nitrogen and water vapor should be adjusted to maintain the proper ratio between the water vapor and the nitrogen. It is also possible to use other inert gases, argon for example, rather than nitrogen.

A second diode 220, illustrated in FIG. 6, can be constructed using essentially the same process described above with reference to FIG. 1 except that an outer ring member 252, (preferably metal or a metal alloy) is positioned concentric with the prefabricated glass ring 75 prior to fusing the glass. This embodiment, as well as the embodiment illustrated in FIG. 1, can be constructed using an alternate jig as illustrated in FIG. 9. For completeness of description, the process for constructing the diode 220 will be discussed with reference to the use of the alternate jig illustrated in FIG. 13 and an alternate prefabricated glass ring 75, illustrated in FIG. 11.

The jig includes a graphite base member 70. In assembling the components of the diode 220 in the jig the fusion is positioned such that lower electrode 226 is in a first recess 72 in graphite base member 70. A second recess 74 is concentric with the first recess 72. The prefabricated glass ring 75 (FIG. 11) is positioned concentric with the fusion. Prefabricated glass ring 75 has an inner diameter larger than the outer diameter of the fusion such that the lower edge of this preform rests in recess 74. The metallic ring 252 is then positioned concentric with the prefabricated glass ring 75.

A graphite support cylinder 76 having a recess 78 along its inner wall is then placed over the metal ring member 252. The larger recess 74 in the base member 70 and the recess 78 in the inner wall of support cylinder 76 are such that the upper surface of the metal ring 252 is in contact with both the base member 70 and the support cylinder 76.

A graphite pressure cylinder 80 having an outer diameter slightly smaller than the inner diameter than the support cylinder 76 and an inner diameter slightly larger than the outer diameter of the top electrode 224 is then positioned to overlie the prefabricated glass ring 75. A weight 82 is placed on pressure cylinder 80 to complete the assembly of the components in the jig. The combination of the pressure cylinder 80 and the weight 82 is in the range of 20-110 grams. The jig may also support a plurality of diodes, however, each diode should be supported as discussed above.

Figure 13:
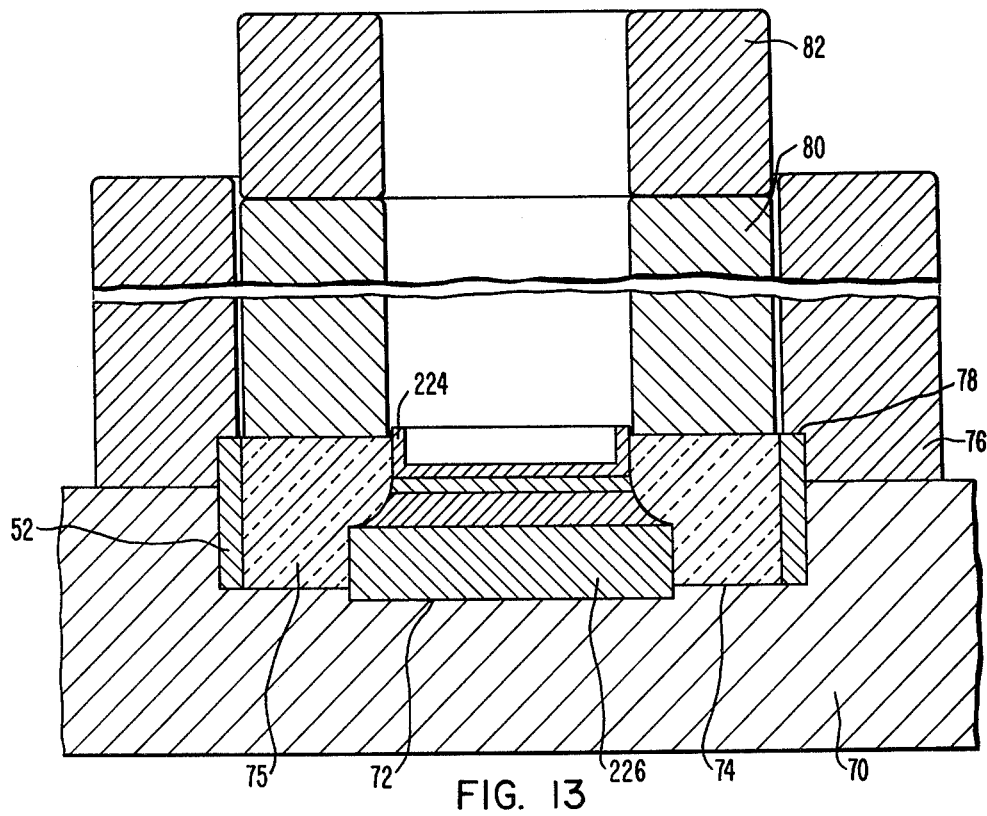
FIG. 13 is an alternate embodiment of the jig utilized to support the fusion and glass preforms in the furnace.

The components of the diode as assembled and illustrated in FIG. 13 are then placed in the fusion furnace and subjected to the controlled atmosphere and temperature cycle previously described with respect to diode 2 illustrated in FIG. 1. This causes the prefabricated glass ring 75 to become soft and fuse to form ring-like glass member 240 of FIG. 6. Alternatively, preformed glass rings of the type illustrated in FIG. 8 could have been used rather than the glass preform 75. Prefabricated glass ring 75 can be formed by sintering suitable powdered glass as previously discussed.

An important factor in selecting the time temperature profile for the furnace to assure success of the process discussed above is a careful examination of the contraction characteristics of the glass as well as the temperature characteristics of the materials comprising the fusion.

The jig illustrated in FIG. 13 can be used to construct the diode 20. Similarly, the jig illustrated in FIG. 9 may be used to construct the second diode 220.

Figure 14:
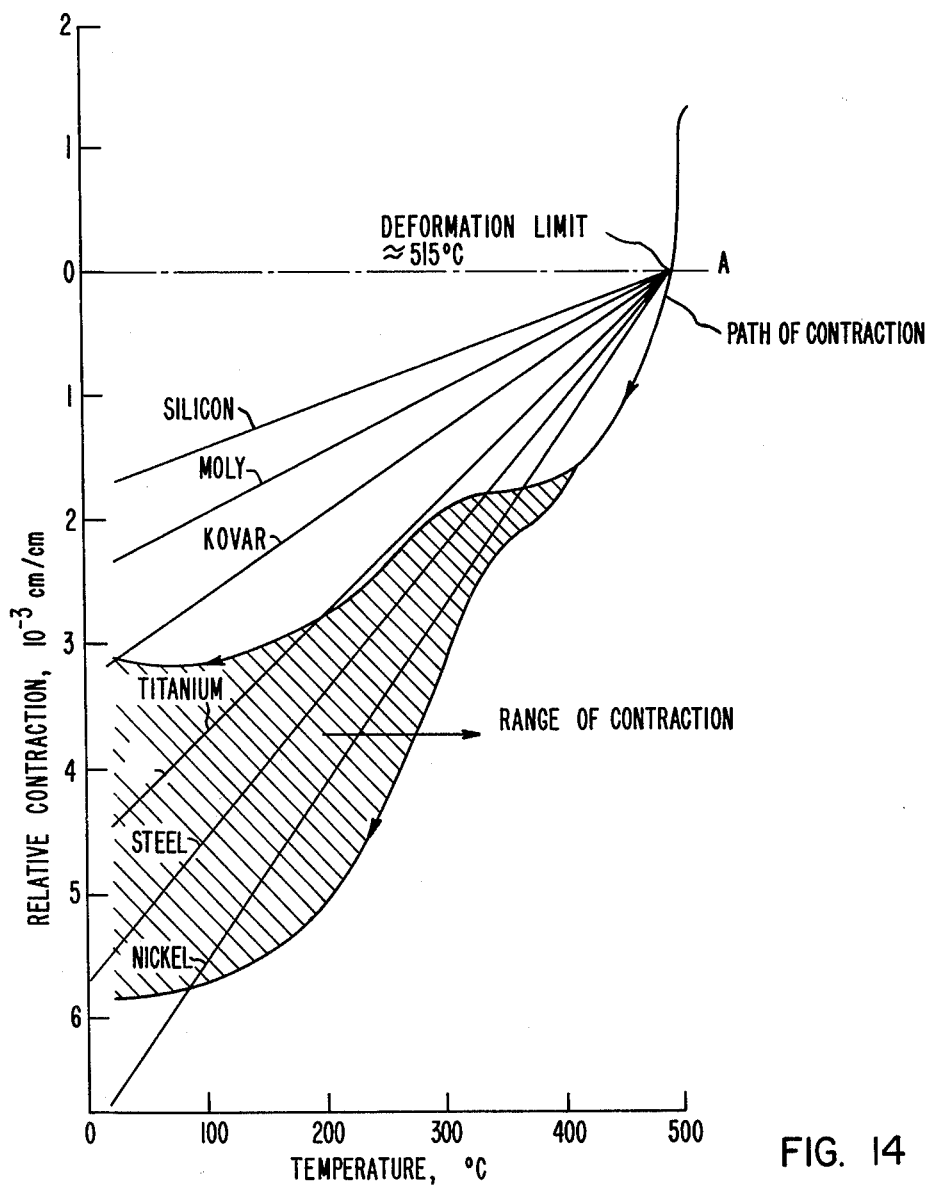
FIG. 14 is a diagram illustrating the contraction characteristics of glass.

The thermal expansion of glass is largely determined by the nature of the vitreous network. Unlike the crystalline state encountered in metals and other materials, the vitreous state is not fixed and can vary continuously depending on prior heat treatment. In the case of borosilicate glasses, it may even depend on the previous melting history. For example, a rapidly cooled glass has a higher specific volume than the same composition cooled more slowly. Actually, there is no single path that glass follows during contraction. FIG. 14 demonstrates that IP-745 glass used in encapsulation the diodes 20 (FIG. 1) can be cooled from 515° C. in various ways to give an entirely different contraction path. Glass type IP745 is a lead borosilicate glass having a composition by weight of $36\pm4\%$ $SiO_2$, $15\%\pm3\%$ $B_2O_3$, $45\pm3\%$ PbO and $3\pm1\%$ $Al_2O_3$. The variations in the contracting paths, depending on the way the glass is cooled, are shown as a shaded area in FIG. 14. If the glass is stabilized for sufficient time, e.g., 20 minutes, at its deformation temperature of approximately 515° C., it will shrink along a path defined by the upper boundary of the shaded area illustrated in FIG. 14. However, if the same glass is heated close to its deformation point and cooled rapidly, an entirely different vitreous state will be formed and high shrinkage occurs along a path defined by the lower boundary or the shaded area illustrated in FIG. 14. The behavior of glass on cooling is generally considerably different than that on heating and depends to a great extent on the method of annealing and thermal history. Upon cooling, glass will not follow the heating curve and normally will not shrink to its original volume.

The silicon as well as various refractory metals and alloys thereof which might be considered for component parts of the diode have relatively well behaved temperature characteristics. That is, they tend to expand and contract along a single line as illustrated in FIG. 14. By contrast, the temperature characteristics of the glass are nonlinear and also not necessarily repeatable since various characteristics of the glass are dependent on its prior history, as discussed above. Therefore, the key to making the process described above work is to select a glass and the temperature cycle for fusing the glass such that harmful stresses are not developed during the process.

The process described above results in the glass having a contraction characteristic within the upper area of those that are possible. Using this temperature cycle discussed above, it is practical to fuse thick (i.e. greater than 30 microns) glass layers directly to the outer surface of the fusion to form a layer protecting the PN junction. Using this cycle, it is also possible to incorporate the outer metal ring 252 into the structure with the outer metal ring 252 maintaining the fused glass slightly in compression. Even though the process described here does not require outer metal compression rings as an essential part of the glass encapsulation, such components, if desired for packaging or any other reason, can be incorporated into the process. Suitable metals for performing this function include Kovar, titanium and steel. Kovar is a trademark for an alloy consisting of 20% nickel, 17% cobalt, 0.2% manganese with the balance iron. This alloy is also sold under the trade name Fernico. A suitable steel is type 304. This steel has a composition by weight of 0.08% carbon (max.), 2.0% manganese (max.), 1.0% silicon (max.), 19.0% chromium, 10% nickel with the remainder iron. Molybdenum has too low a temperature contraction coefficient resulting in the glass ring being placed in tension which is sufficiently high to rupture the glass. By contrast, nickel has a rather high temperature expansion coefficient resulting in the glass being placed in sufficient compression to cause the rupture of the diode. It should also be noted that outer rings of ceramic materials are also usable. For example, ceramics, including zircon ($Z_2SiO_4$), mullite ($3Al_2O_3 2SiO_2$), porcelain, titanium ($TiO_2$) and spinel ($MgAl_2O_4$) are also usable.

It should also be noted that thermal history for the glass tubing from which the glass rings are cut effects its thermal characteristics. Since commercially available stress relieved glass tubing is made from molten glass all of the prefabricated glass rings cut from such tubing can be considered as having substantially the same prior thermal histories. However, it is believed that slightly higher yields might be realized by carefully controlling the manufacturing process for these tubes. Additionally, the glass rings can be formed by sintering powered glass. However, as previously mentioned, superior results have been achieved by using rings cut from stress relieved glass tubing.

I claim:

1. A method for fusing a glass member to a body of semiconductor material having a PN junction therein, a top surface, a bottom surface and an edge portion extending therebetween, said PN junction terminating at said edge portion, to form a layer protecting said PN junction, comprising the steps of:
    (a) disposing said glass member about said edge portion of said body of semiconductor material;
    (b) disposing said body of semiconductor material and said glass member in an atmosphere comprising a predetermined mixture of an inert gas and water vapor;
    (c) heating and cooling said body of semiconductor material and said glass member thereby causing said glass member to fuse to at least said edge portion of said body of semiconductor material.

2. A method for fusing glass to a body of semiconductor material to form a layer protecting a PN junction therein in accordance with claim 1 wherein said inert gas is nitrogen.

3. A method for fusing glass to a body of semiconductor material to form a layer protecting a PN junction therein in accordance with claim 2 wherein the total pressure of said predetermined atmosphere is one atmosphere and the partial presssure of said water vapor is greater than $10^{-4}$ atmospheres.

4. A method for fusing glass to a body of semiconductor material to form a layer protecting a PN junction therein in accordance with claim 3 wherein said water vapor has a partial pressure in the range of $10^{-3.5}$ to $10^{-1}$ atmospheres.

5. A method for fusing glass to a body of semiconductor material to form a layer protecting a PN junction therein in accordance with claim 4 wherein the partial pressure of said water vapor is in the range of $10^{-3}$ to $10^{-2}$ atmospheres.

6. A method for fusing glass to a body of semiconductor material to form a layer protecting a PN junction therein, in accordance with claim 5 wherein said body of semiconductor material and said glass material are disposed in said predetermined atmosphere and heated and cooled in accordance with a predetermined program comprising:
    (a) increasing the temperature of said body of semiconductor material and said glass material to a temperature in the range of 700° to 720° C. and maintaining this temperature for a time interval in the range of 20 minutes;
    (b) decreasing the temperature of said atmosphere, said body of semiconductor material and said glass material to a temperature in the range of 520° to 530° C. and maintaining this temperature for a time interval in the range of 10 minutes;
    (c) decreasing the temperature of said atmosphere, said body of semiconductor material and said glass material to a temperature in the range of 475° to 485° C. and maintaining this temperature for a time interval in the range of 20 minutes;
    (d) decreasing the temperature of said atmosphere, said body of semiconductor material and said glass material to a temperature in the range of 405° to 415° C. and maintaining this temperature for a time interval in the range of 30 minutes; and
    (e) cooling said atmosphere, said body of semiconductor material and said glass material to ambient temperature.

7. A method for fusing glass to a body of semiconductor material to form a layer protecting a PN junction therein in accordance with claim 1 wherein said glass material is a lead-aluminum borosilicate glass.

8. A method for fusing glass to a body of semiconductor material to form a layer protecting a PN junction therein in accordance with claim 7 wherein said lead-aluminum borosilicate glass has a composition by weight of 36±4% $SiO_2$, 15±3% $B_2O_3$, 45±3% PbO and 3±1% $Al_2O_3$.

9. A method for fusing glass to a body of semiconductor material to form a layer protecting a PN junction therein in accordance with claim 1 wherein said glass material comprises two regions, said first region comprising a lead aluminum borosilicate glass and being disposed about and adjacent said edge portion of said body of semiconductor material and said second region comprising a zinc borosilicate glass and being disposed about and adjacent to said first region.

10. A method for fusing glass to a body of semiconductor material to form a layer protecting a PN junction therein in accordance with claim 9 wherein said first and second regions comprising said glass material are prefabricated glass rings.

11. A method for fusing glass to a body of semiconductor material to form a layer protecting a PN junction therein in accordance with claim 10 wherein said prefabricated glass rings are formed by cutting glass tubing into sections of appropriate length.

12. A method for fusing glass to a body of semiconductor material to form a layer protecting a PN junction therein in accordance with claim 10 wherein said prefabricated glass rings are formed by sintering glass powder.

13. A method of fusing glass to an edge portion of a body of semiconductor material having substantially flat top and bottom surfaces with said edge portion extending therebetween, and a PN junction terminating at said edge portion, comprising the steps of:
    (a) disposing glass material comprising at least one prefabricated glass ring formed by slicing glass tubing about said body of semiconductor material and adjacent said edge portion of said body of semiconductor material;

(b) disposing said glass material and said body of semiconductor material in an atmosphere comprising a mixture of an inert gas and water vapor with the total pressure being in the range of one atmosphere and the partial pressure of the water vapor being less than $10^{-3}$ atmospheres;

(c) heating said body of semiconductor material, said glass material and said atmosphere to a temperature in the range of 710° C. in a time interval in the order of twenty-five minutes and maintaining this temperature for a time interval in the order of twenty minutes;

(d) decreasing the temperature of said body of semiconductor material, said glass material and said atmosphere to a temperature in the range of 525° C. in a time interval in the range of fifteen minutes and maintaining this temperature for a time interval in the range of ten minutes;

(e) decreasing the temperature of said body of semiconductor material, said glass material and said atmosphere to a temperature in the range of 480° C. in a time interval in the range of fifteen minutes and maintaining this temperature for a time interval in the range of twenty minutes;

(f) decreasing the temperature of said body of semiconductor material, said glass material and said atmosphere to a temperature in the range of 410° C. in a time interval in the range of fifteen minutes and maintaining this temperature for a time interval in the range of thirty minutes;

(g) decreasing the temperature of said body of semiconductor material, said glass material and said atmosphere to ambient temperature, the initial cooling rate being in the order of 5° C. per minute, thereby fusing said glass material to said edge portion to form a protective layer overlying said PN junction.

14. A method of fusing glass to an edge portion of a body of semiconductor material having substantially flat top and bottom surfaces with said edge portion extending therebetween and a PN junction terminating at said edge portion in accordance with claim 13 wherein said glass material comprises first and second prefabricated glass rings cut from glass tubing, said first glass ring being disposed about said body of semiconductor material and adjacent said PN junction and said second glass ring being disposed about and adjacent to said first glass ring.

* * * * *